(12) United States Patent
Gangopadhyay et al.

(10) Patent No.: US 11,340,975 B2
(45) Date of Patent: May 24, 2022

(54) SYSTEM MONITOR

(71) Applicant: TEXAS INSTRUMENTS INCORPORATED, Dallas, TX (US)

(72) Inventors: Indranil Gangopadhyay, Plano, TX (US); Wan Laan Jackie Hui, Allen, TX (US); Kyl Wayne Scott, Richardson, TX (US); Quanqing Hu, Irving, TX (US); Ivo Francesco Marocco, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 16/794,067

(22) Filed: Feb. 18, 2020

(65) Prior Publication Data
US 2020/0264945 A1     Aug. 20, 2020

Related U.S. Application Data

(60) Provisional application No. 62/903,436, filed on Sep. 20, 2019, provisional application No. 62/807,145, filed on Feb. 18, 2019.

(51) Int. Cl.
*G06F 11/07*     (2006.01)
*G01R 31/371*    (2019.01)
*G06F 13/40*     (2006.01)
*G06F 1/3296*    (2019.01)

(52) U.S. Cl.
CPC ........ *G06F 11/0772* (2013.01); *G01R 31/371* (2019.01); *G06F 1/3296* (2013.01); *G06F 11/0721* (2013.01); *G06F 11/0739* (2013.01); *G06F 11/0757* (2013.01); *G06F 13/4027* (2013.01)

(58) Field of Classification Search
CPC ............. G06F 11/0739; G06F 11/0721; G06F 11/0772; G06F 11/0757; G01R 31/007
See application file for complete search history.

(56) References Cited

U.S. PATENT DOCUMENTS

| | | | |
|---|---|---|---|
| 2009/0099802 A1* | 4/2009 | Barsoukov | G01R 31/3648 702/65 |
| 2013/0169038 A1* | 7/2013 | King | H02J 7/0031 307/10.1 |
| 2016/0170824 A1* | 6/2016 | Hamo | G06F 11/0751 714/763 |
| 2016/0261127 A1* | 9/2016 | Worry | H01M 10/425 |

\* cited by examiner

*Primary Examiner* — Nadeem Iqbal
(74) *Attorney, Agent, or Firm* — Mark A. Valetti; Charles A. Brill; Frank D. Cimino

(57) ABSTRACT

At least some aspects of the disclosure provide for a system. In at least some examples, the system includes a microcontroller, an energy storage element, a monitoring circuit, and a communication bridge. The monitoring circuit is coupled to the energy storage element and configured to determine whether a fault associated with the energy storage element is present, generate an indication of the fault when the fault with the energy storage element is present, and transmit the indication of the fault. The communication bridge is configured to receive the indication of the fault and assert a fault signal and transmit the fault signal to the microcontroller.

15 Claims, 8 Drawing Sheets

SYSTEM MONITOR

CROSS-REFERENCE TO RELATED APPLICATIONS

The present application claims priority to U.S. Provisional Patent Application No. 62/807,145, which was filed Feb. 18, 2019 and is titled "Automotive Battery Monitor System With Auto Wakeup On System Fault." The present application further claims priority to U.S. Provisional Patent Application No. 62/903,436, which was filed Sep. 20, 2019 and is titled "Automotive Battery Pack Monitor." Both of these provisional applications are hereby incorporated herein by reference in their entirety.

BACKGROUND

In some systems, it is advantageous to monitor certain conditions, statuses, or other data points in the system. The monitoring allows for system performance and/or analytics reporting, enforcement of safety mechanisms (e.g., such as turn-off or forced reduction in performance if monitored conditions exceed permitted thresholds), trimming or tuning of system performance, etc. Some approaches to this monitoring include constant polling to obtain data. However, this approach can be expensive from perspectives of both communication bandwidth consumption and power consumption and can result in an extended fault detection time interval. Other approaches to this monitoring include the inclusion of dedicated fault detection hardware that is daisy chained between devices so that a fault signal is forwarded to a controller through the daisy chain. However, this approach can also be expensive due to a requirement for additional components and couplings and due to power consumed, because at least some implementations of this approach prevent the controller from being placed in a low-power mode (e.g., idle or shutdown).

SUMMARY

At least some aspects of the disclosure provide for a circuit. In at least some examples, the circuit includes a microcontroller and a communication bridge. The communication bridge is coupled to the microcontroller and configured to implement a state machine. The state machine comprises a first state configured to receive a data frame comprising data and a second state configured to determine whether a system fault is indicated in the data frame. The first state transitions to the second state when the data frame is received. The state machine further comprises a third state configured to assert a fault signal when the system fault is indicated in the data frame. The second state transitions to the third state when the system fault is indicated in the data frame. The state machine further comprises a fourth state configured to transmit the data from the data frame to the microcontroller. The third state transitions to the fourth state after asserting the fault signal.

Other aspects of the disclosure provide for a circuit. In at least some examples, the circuit includes a register and a monitoring circuit coupled to the register and configured to implement a state machine. The state machine comprises a first state configured to generate a data frame including at least some data from the register and a second state configured to determine a system fault status. The first state transitions to the second state after generating the data frame. The state machine further comprises a third state configured to set a fault status indication of the data frame when a fault exists in the system. The second state transitions to the third state when the monitoring circuit detects a fault. The state machine further comprises a fourth state configured to transmit the data frame to a next device. The second state transitions to the fourth state when the monitoring circuit does not detect a fault. The third state transitions to the fourth state after setting the fault status indication of the data frame.

Other aspects of the disclosure provide for a system. In at least some examples, the system includes a microcontroller, an energy storage element, a monitoring circuit, and a communication bridge. The monitoring circuit is coupled to the energy storage element and configured to determine whether a fault associated with the energy storage element is present, generate an indication of the fault when the fault with the energy storage element is present, and transmit the indication of the fault. The communication bridge is configured to receive the indication of the fault and assert a fault signal and transmit the fault signal to the microcontroller.

BRIEF DESCRIPTION OF THE DRAWINGS

For a detailed description of various examples, reference will now be made to the accompanying drawings in which.

DETAILED DESCRIPTION

Figure 1:
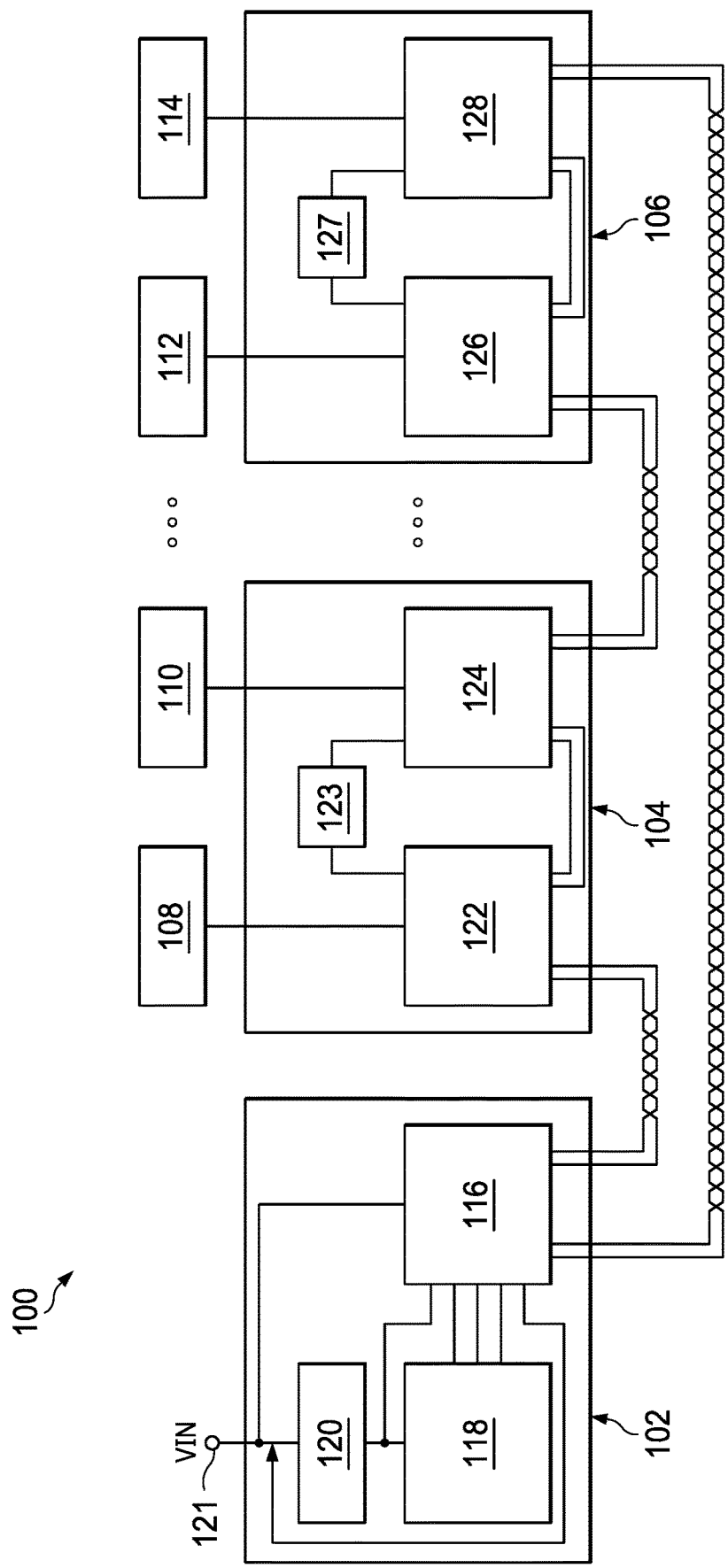
FIG. 1 shows a block diagram of an illustrative system in accordance with various examples.

In various systems, including energy storage systems such as those found in hybrid or electric vehicles, it is sometimes advantageous or preferred to monitor a status of the energy storage cells (e.g., batteries). For example, monitoring the batteries can provide an indication of a voltage of the batteries, temperatures, the existence of a fault, etc. This information can then in turn be used for decision making regarding the energy storage system, such as shutting down the system, reducing performance of the system, bypassing portions of the system, generating a notice that the system requires service, etc.

Various monitoring approaches or techniques exist that enable a microcontroller to obtain battery information, but at least some of these approaches can include undesirable elements as discussed elsewhere herein. At least some aspects of the present disclosure provide for a system monitor that conveys fault information without requiring constant polling or dedicated fault output interfaces, as discussed elsewhere herein. In at least one implementation, communication exists between a controller, such as a microcontroller, microprocessor, or other processing device and one or more monitor units. This communication includes one or more pieces of data, in at least some examples arranged in data frames, each of which includes a plurality of bytes of data.

Sometimes, these frames of data include data bits that are ignored, unnecessary, redundant, or otherwise unused. For example, in some implementations each byte of the data frame follows a same general format that includes a start of frame (SOF) data bit. For the first byte appearing in a data frame, that SOF data bit carries significance and indicates to a device receiving the data frame that the byte having a set SOF data bit is the first byte of the data frame. However, the SOF data bits of subsequent bytes of the data frame are then unused with respect to containing meaningful data and are unutilized overhead. In these examples, at least some implementations of the system monitor of the present disclosure repurpose the SOF data bit of at least some of the subsequent bytes of the data frame to indicate a fault status in a system. For example, a value of the SOF data bit of one byte, two bytes, three bytes, etc., may indicate the fault status. In at least some examples, reuse of the SOF data bit as described herein has certain benefits with regard to backward compatibility (e.g., not requiring support for a different length data frame) that make use of the SOF data bit advantageous over other data bits. For example, repurposing of otherwise unused SOF data bits enables support for fault detection and reporting/notification in existing communication data frames without adding additional data bits and/or bytes to the data frame for the purpose of performing the fault detection and/or reporting/notification. However, while the SOF data bit is described herein as being repurposed for at least some bytes of a data frame, the present disclosure is not limited to the SOF data bit of any particular bytes of the data frame or to a SOF data bit. Instead, any suitable bit(s) of any suitable byte(s) of a data frame may be repurposed to indicate a fault status in a system, or, alternatively, no data bits may be repurposed and new data bit(s) and/or byte(s) may be added to support fault reporting functionality.

In at least some implementations, a controller communicates (e.g., a command frame) with a first monitor, which communicates with a second monitor, and so forth until a final monitor in a daisy chain of monitors communicates back to the controller. The communication from the monitor back to the controller (e.g., a response frame), in at least some examples, follows the same communication links in a reverse order that the communication from the controller to the monitor followed. In other examples, the controller communicates with a monitor along the daisy chain of monitors without communication back to the controller (e.g., such as when no response to the controller is necessary). As a data frame passes through each of the monitors of the system, the monitor has an opportunity to alter the data frame, such as to indicate a fault in that monitor. For example, regardless of whether a data frame is addressed to a particular monitor, when the data frame passes through the monitor either from the controller to a monitor to which the data frame is addressed, or from the monitor from which a data frame originates for transmission back to the controller, a fault status can be indicated in the data frame. In this way, the fault status can be indicated in a command frame or in a response frame (each of which is collectively referred to hereinafter as a data frame). When indicated in the command frame, in at least some examples, a monitor in the daisy chain copies the indication to a response frame. Thus, when the controller receives the data frame, the controller becomes altered to the existence of a fault in the system. In at least some examples, the fault indication included in the SOF data bit only indicates an existence of a fault in the system and not a nature of the fault or a location of the fault. In other examples of a fault monitor system, such as when a fault data byte is added to the data frame, other information may be provided, such as a device address of a monitor reporting the fault, a nature or type of the fault, etc.

As mentioned above, a value of the SOF data bit of one byte, two bytes, three bytes, etc., may indicate the fault status. For example, in some implementations a monitor reporting a fault sets the SOF data bit of one byte of the data frame to a logical 1. In other examples, the monitor provides data redundancy by setting the SOF data bit of more than one byte to a logical 1. In this way, if a portion of the data frame including an SOF data bit set to indicate a fault is corrupted prior to receipt by the controller, the controller retains an ability to determine the existence of the fault through a redundantly set SOF data bit of another byte of the data frame. Alternatively, which byte has a SOF data bit set to a logical 1 may be determined by a type of fault being reported (e.g., a temperature fault reported via a SOF data bit of one byte, a voltage fault reported via a SOF data bit of another byte, etc.).

In at least some implementations, a communication bridge exists between the monitors and the controller. The communication bridge, in some examples, receives and processes the data frame from the monitors, generating a fault output signal when a SOF data bit of the data frame indicates an existence of a fault. The fault output signal is provided to the controller by the bridge device.

In some examples, when the bridge device outputs the fault output signal, the controller is in a low-power state such that the controller is idle, shutdown, or otherwise in a state that prevents the controller from receiving the fault output signal. In such examples, the communication bridge further generates and outputs a trigger signal. The trigger signal, in at least some examples, causes the controller to exit the low-power state. The trigger signal causes the controller to exit the low-power state, in some examples, by causing a power management component to provide power to the controller. In other examples, the trigger signal is received by the controller and causes the controller to exit the low-power state. When the controller exits the low-power state, the controller receives the fault output signal that was output by the communication bridge. Alternatively, in at least some examples such as when the controller is in the low-power state, the bridge outputs a heartbeat signal in place of the data frame. The heartbeat signal is output, in some examples, periodically, such as about every 400 milliseconds. The heartbeat signal progresses through the daisy chain of monitors and back to the communication bridge. For example, a monitor receives the heartbeat tone and generates another heartbeat tone that is forwarded to an upstream monitor in the daisy chain until a final monitor in the daisy chain transmits the heartbeat tone to the communication bridge. Conversely, if one of the monitors does not receive the heartbeat tone, does not receive the heartbeat tone within a predetermined or expected period of time, or detects a fault, that respective monitor generates and transmits a fault tone in place of the heartbeat tone. If the communication bridge does not receive the heartbeat tones for a predetermined period of time (e.g., such as about 1 second, indicating that two heartbeat tones have been missed), the communication bridge determines that a fault exists and outputs the fault output signal and/or the trigger signal. Similarly, if the communication bridge receives a fault tone instead of a heartbeat tone, the communication bridge determines that a fault exists and outputs the fault output signal and/or the trigger signal.

In at least some examples, a management unit (e.g., that includes the controller and/or the bridge) transmits the data frame to a monitor coupled to the management unit. The data frame is forwarded through one or more monitors via a daisy chain until it reaches a last monitor in the daisy chain, or a monitor to which the data frame is addressed. In at least some examples, a response frame is then transmitted back to the management unit from one of the monitors in the daisy chain. However, sometimes communication couplings can be damaged or break. In some of the alternative approaches to system monitoring, this can entirely prevent any future monitoring until the damaged coupling is repaired or replaced, if either of those options is available. However, the system monitor of the present disclosure, when a break is detected, retains an ability to communicate and detect faults. For example, in at least one implementation, the management unit transmits two data frames—one to the first monitor in a daisy chain and one to the last monitor in the daisy chain. The data frames then progress through the daisy chain of monitors from one or both ends of the daisy chain until reaching the broken or damaged coupling. In this way, the management unit retains an ability to communicate with, and detect faults in, a system despite damage to a communication coupling in the system. In at least some examples, after receiving the fault output signal, the controller polls the monitors (e.g., sends data frames addressed to each monitor requesting data from the specifically addressed monitor) to learn more information about the fault, such as a location of the fault, nature of the fault, etc.

Turning now to FIG. 1, a block diagram of an illustrative system 100 is shown. In at least some examples, the system 100 is representative of an energy storage system. In other examples, the system 100 is representative of at least a portion of a hybrid or electric vehicle (whether land, air, or sea and manner, semi-autonomous, or fully-autonomous), such as a sub-system of the hybrid or electric vehicle. For example, at least some implementations of the system 100 are representative of a powertrain sub-system of a vehicle and/or a power sub-system of a vehicle. In yet other examples, the system 100 is representative of any system in which one or more components are monitored by one or more monitors that communicate with a management unit and/or controller. The components being monitored may be batteries, sensors, circuits, circuit components, articulating components, etc., or any combinations thereof. Moreover, in some examples, the system 100 monitors multiple different types of components (e.g., the system 100 may monitor both batteries and sensors, etc.).

The system 100 includes, in some examples, a management unit 102, a monitoring unit 104, and a monitoring unit 106. The system 100 further includes, or is configured to couple to, a component 108, a component 110, a component 112, and a component 114. In some examples, each of the component 108, the component 110, the component 112, and the component 114 are energy storage elements, such as batteries. In other examples, any one or more of the component 108, the component 110, the component 112, or the component 114 are any other suitable component being monitored by the system 100. While the system 100 includes only two monitoring units, each monitoring two components, in various examples, the system 100 includes any number of monitoring units coupled together, each of which monitors any number of components.

The management unit 102, in some examples, includes a communication bridge 116, a microcontroller 118, and a power management component 120. In at least some examples, the power management component 120 controls the providing of power to the microcontroller 118 and, in some examples, the communication bridge 116. For example, the power management component 120 couples to a node 121 at which an input voltage (VIN) is present and further couples to a VIN terminal of the communication bridge 116. The communication bridge 116 includes a first communication interface (interfaces not expressly depicted) configured to couple to the monitoring unit 104 and a second communication interface configured to couple to the monitoring unit 106. The communication bridge 116 further includes one or more couplings with the microcontroller 118 to facilitate data flow between the communication bridge 116 and the microcontroller 118. In various examples, one or more components, such as isolation components, are coupled to one or more ends of the couplings within the system 100.

Data transmitted between the communication bridge 116 and the microcontroller 118 can include the fault output signal, as discussed elsewhere herein, data for inclusion in a data frame to be output by the communication bridge 116, data received by the communication bridge 116 in a data frame, or any other suitable data. In at least some examples, the communication bridge 116 is further coupled to the power management component 120. For example, the communication bridge 116 is coupled to an enable input of the power management component 120 such that an asserted output signal of the communication bridge 116 causes the power management component 120 to become enabled and provide power to the microcontroller 118.

The communication bridge 116, in at least some examples, includes one or more components capable of, or suitable for, performing logical operations. For example, at least some implementations of the communication bridge 116 include components suitable for performing logical operations to implement a state machine. Accordingly, in at least some examples, the communication bridge 116 is a state machine circuit that implements one or more state machines. In at least some examples, the communication bridge 116 is alternatively, or additionally, referred to as an integrated circuit. Various implementations of the communication bridge 116 include additional functionality not described herein, where that additional functionality is controlled and/or implemented through one or more additional state machines. In at least some examples, the communication bridge 116 implements a state machine to perform functions of the present disclosure, such as detection, in a received data frame, of an indication of a fault and generation of the fault output signal based on such detection. The state machine, or alternatively another state machine, performs other functions of the present disclosure, such as output of, and monitoring for, a heartbeat signal and generation of the fault output signal and trigger signal based on a predetermined number of heartbeat signals not being detected or a heartbeat signal not being detected for a predetermined period of time.

The monitoring unit 104, in at least some examples, includes a monitoring circuit 122, a storage element 123, and a monitoring circuit 124. The monitoring unit 106, in at least some examples, includes a monitoring circuit 126, a storage element 127, and a monitoring circuit 128. While each monitoring unit of the system 100 is illustrated as including two monitoring circuits, in in at least some examples, one or more of the monitoring units includes fewer, or more, monitoring circuits. Additionally, while each monitoring unit of the system 100 is illustrated as including one storage element, in other examples, either monitoring unit may include additional storage elements. Additionally, in at least some examples, the storage elements may be implemented as components of a respective monitoring circuit. In at least some examples, the storage element 123 and the storage element 127 each comprise a plurality of registers configured to store data. The monitoring circuit 122 and/or the monitoring circuit 124 interact with the storage element 123 to read data from, or write data to, the storage element 123. The monitoring circuit 126 and/or the monitoring circuit 128 interact with the storage element 127 to read data from, or write data to, the storage element 127.

The monitoring circuit 122 is coupled to the communication bridge 116, the monitoring circuit 124, and the storage element 123. The monitoring circuit 122 is further coupled to the component 108 and configured to monitor the component 108. The monitoring circuit 124 is coupled to the monitoring circuit 122, the monitoring circuit 126, and the storage element 123. The monitoring circuit 124 is further coupled to the component 110 and configured to monitor the component 110. The monitoring circuit 126 is coupled to the monitoring circuit 124, the monitoring circuit 128, and the storage element 127. The monitoring circuit 126 is further coupled to the component 112 and configured to monitor the component 112. The monitoring circuit 128 is coupled to the monitoring circuit 126, the communication bridge 116, and the storage element 127. The monitoring circuit 128 is further coupled to the component 114 and configured to monitor the component 114. Additionally, while at least some couplings in the system 100 are illustrated as two-wire couplings (e.g., such as couplings between the management unit 102, the monitoring unit 104, and the monitoring unit 106, and within the monitoring unit 104 and the monitoring unit 106), in other examples, the couplings are single-wire. Further, in at least some examples, one or more additional components are coupled in-line between a respective monitoring circuit and the component to which the monitoring circuit is coupled.

In a first example of operation of the system 100, the communication bridge 116 outputs a data frame to the monitoring circuit 122. The data frame, in at least some examples, includes data received by the communication bridge 116 from the microcontroller 118. For example, the data frame includes a device address of one of the monitoring circuit 122, the monitoring circuit 124, the monitoring circuit 126, or the monitoring circuit 128. In at least some examples, the data frame further includes data provided by the microcontroller 118 for the one of the monitoring circuit 122, the monitoring circuit 124, the monitoring circuit 126, or the monitoring circuit 128 to which the data frame is addressed. The data frame progresses in a sequential manner through the daisy chain of couplings that create a closed loop beginning and ending at the communication bridge 116. For example, the data frame progresses from the communication bridge 116 to the monitoring circuit 122, from the monitoring circuit 122 to the monitoring circuit 124, from the monitoring circuit 124 to the monitoring circuit 126, from the monitoring circuit 126 to the monitoring circuit 128, and from the monitoring circuit 128 to the communication bridge 116.

As the data frame (e.g., either a command frame or a response frame) passes through the monitoring circuit 122, the monitoring circuit 124, the monitoring circuit 126, and the monitoring circuit 128, any one or more of the monitoring circuit 122, the monitoring circuit 124, the monitoring circuit 126, or the monitoring circuit 128 may set one or more data bits of the data frame to indicate a presence of a fault. The fault is, in some examples, a fault with the component 108, the component 110, the component 112, and/or the component 114. In other examples, the fault is a fault with the monitoring circuit 124, the monitoring circuit 126, and/or the monitoring circuit 128. In at least some examples, one or more SOF data bits of one or more bytes other than a first byte of the data frame are set to a logical 1 value to indicate the presence of a fault. In at least some examples, the monitoring circuit 122, the monitoring circuit 124, the monitoring circuit 126, and/or the monitoring circuit 128 sets the data bit(s) to indicate the presence of the fault by performing a logical OR operation between the data bit(s) and a value of logical 1.

When the data frame is received by the communication bridge 116 from the monitoring circuit 128, in at least some examples, the communication bridge 116 examines the data frame to determine whether a fault exists in the system 100. In some examples, the communication bridge 116 determines that a fault exists in the system 100 based on a single data bit being set to a logical 1. In other examples, the communication bridge 116 determines that a fault exists in the system 100 based on multiple data bits being set to a logical 1. In yet other examples, the communication bridge 116 determines that a fault exists in the system 100 based on a majority of a particular set of data bits being set to a logical 1 (e.g., a majority of SOF data bits of a particular set of bytes of the data frame being set to logical 1). When the communication bridge 116 determines that a fault exists in the system 100 based on a value of a data bit of the data frame, in at least some examples, the communication bridge 116 outputs the fault output signal indicating presence of a fault to the microcontroller 118. In some examples, the communication bridge 116 further outputs additional data received in the data frame to the microcontroller 118. In at least some examples, the microcontroller 118 takes one or more actions based on the fault output signal indicating the presence of a fault in the system 100. For example, the microcontroller 118 shuts down, or outputs a signal that causes another component (not shown) to shut down, at least a portion of the system 100, modifies a usage of a circuit, device, or component from which the fault originated, limits power consumption of the system 100 or another device (not shown) coupled to the system 100, generates and outputs an alert or message warning of the fault, or takes any other suitable action.

In a second example of operation of the system 100, the microcontroller 118 is in a low-power state. When the microcontroller 118 is in the low-power state, the microcontroller 118 does not send data to the communication bridge 116 to enable the communication bridge 116 to generate and/or output the data frame to the monitoring circuit 122. However, faults can still occur in the system 100 when the microcontroller 118 is in the low-power mode. In at least some examples, it is undesirable and/or potentially detrimental to the system 100 to wait until the microcontroller 118 ends a predetermined period of time in the low-power mode for the microcontroller 118 to learn of the presence of the fault. Accordingly, when the microcontroller 118 is in the low-power state, the communication bridge 116 generates and outputs a heartbeat tone to the monitoring circuit 122. The heartbeat tone progresses in a sequential manner through the daisy chain of couplings that create the closed loop beginning and ending at the communication bridge 116. For example, the heartbeat tone progresses from the communication bridge 116 to the monitoring circuit 122, from the monitoring circuit 122 to the monitoring circuit 124, from the monitoring circuit 124 to the monitoring circuit 126, from the monitoring circuit 126 to the monitoring circuit 128, and from the monitoring circuit 128 to the communication bridge 116. If any of the monitoring circuit 122, monitoring circuit 124, monitoring circuit 126, or monitoring circuit 128 detects the presence of a fault in the system 100, that respective monitoring circuit 122, monitoring circuit 124, monitoring circuit 126, or monitoring circuit 128 does not transmit a heartbeat tone. Instead, that respective monitoring circuit 122, monitoring circuit 124, monitoring circuit 126, or monitoring circuit 128 generates and outputs a fault tone. When the communication bridge 116 receives the fault tone instead of the heartbeat tone, the communication bridge 116 determines that a fault exists in the system 100.

Alternatively, if the communication bridge 116 does not receive a heartbeat tone for a predetermined period of time (e.g., such as about 1 second when a heartbeat tone is transmitted about every 400 milliseconds), the communication bridge 116 determines that a fault exists in the system 100. In at least some examples, the heartbeat tone is a signal having a predetermined pattern of pulses. Similarly, the fault tone is another signal having a different predetermined pattern of pulses. In at least some examples, the fault tone is the same for each of the monitoring circuit 122, monitoring circuit 124, monitoring circuit 126, and monitoring circuit 128. In other examples, one or more of the monitoring circuit 122, monitoring circuit 124, monitoring circuit 126, or monitoring circuit 128 is configured to generate and output a unique fault tone. In yet other examples, the predetermined pattern of pulses of the fault tone is unique to a type of fault detected.

In at least some examples, the communication bridge 116 is also in a low-power state in which the communication bridge 116 is powered but asleep (e.g., in a sleep mode). In such examples, the power management component 120 may further be in a low-power state and asleep. In at least some examples, the communication bridge 116 wakes from the sleep mode when the communication bridge 116 is asleep and receives a fault tone. When the communication bridge 116 wakes from the sleep mode, the communication bridge 116 generates and outputs the fault output signal. If the communication bridge 116 is instead in a shutdown mode (e.g., in which less power is consumed than when in the sleep mode), the communication bridge 116 wakes from the shutdown mode and validates the fault tone. If the fault tone is validated, the communication bridge 116 generates and outputs the fault output signal. Similarly, the power management component 120 receiving the trigger signal from the communication bridge 116 may wake the power management component 120 and return the power management component 120 to normal operation, supplying power to the microcontroller 118 to bring the microcontroller 118 out of the low-power state or bring the microcontroller 118 back from a no-power state or off mode). In such examples when the communication bridge 116, the microcontroller 118, and the power management component 120 are each in low-power states, it is sometimes still desirable to learn of a fault in the system 100 in a timely manner (e.g., without waiting for a scheduled periodic exit from the low-power states). In such examples, the monitoring circuit 122, the monitoring circuit 124, the monitoring circuit 126, and the monitoring circuit 128 are capable of generating a fault tone and outputting the fault tone. The fault tone propagates back to the communication bridge 116, through the daisy chain of the monitoring circuit 122, the monitoring circuit 124, the monitoring circuit 126, and the monitoring circuit 128. When the communication bridge 116 receives the fault tone and is in the sleep mode, the communication bridge 116 wakes substantially as described above when receiving a fault tone in response to transmitting a heartbeat tone while the microcontroller 118 is in the low-power state.

When the communication bridge 116 determines that a fault exists in the system 100, either through receipt of the fault tone or a lack of receipt of the heartbeat tone for a predetermined period of time, the communication bridge 116 generates and outputs the fault output signal indicating the presence of the fault. However, because the microcontroller 118 is in the low-power state, the microcontroller 118 does not receive the fault output signal. To remove the microcontroller 118 from the low-power state, in at least some examples, the communication bridge 116 generates and outputs the trigger signal. The trigger signal, in at least some examples, is an enable or interrupt signal that causes the power management component 120 to provide power to the microcontroller 118 and/or otherwise cause the microcontroller 118 to exit the low-power state. When the microcontroller 118 exits the low-power state, the microcontroller 118 returns to operation substantially the same as discussed above with respect to the first example of operation of the system 100. In this way, when the microcontroller 118 exits the low-power state, the microcontroller 118 receives the fault output signal indicating the presence of the fault in the system 100 and takes one or more actions based on the presence of the fault.

In at least some examples, the first example of operation of the system 100 and the second example of operation of the system 100 are complementary such that they are implemented simultaneously. For example, a communication bridge 116 that is capable of determining that a fault exists in the system 100 when the microcontroller 118 is in the low-power state is further capable of determining that a fault exists in the system 100 when the microcontroller 118 is not in the low-power state. In at least some examples, the communication bridge 116 achieves this functionality through the implementation and/or execution of multiple state machines running concurrently or non-concurrently.

While the present disclosure generally describes the communication bridge 116 as transmitting to the monitoring circuit 122 and receiving from the monitoring circuit 128, communication in the opposite direction is also possible. In such an implementation, the communication bridge 116 will transmit to the monitoring circuit 128 and receive from the monitoring circuit 122. Furthermore, in at least some examples, the communication bridge 116 transmits to both the monitoring circuit 122 and the monitoring circuit 128 and receives from both the monitoring circuit 122 and the monitoring circuit 128. In some examples, the transmitting to both the monitoring circuit 122 and the monitoring circuit 128 is performed substantially concurrently. In other examples, the transmitting to both the monitoring circuit 122 and the monitoring circuit 128 is performed consecutively. For example, if a communication coupling becomes unusable in the daisy chain between the monitoring circuit 122 and the monitoring circuit 128, the daisy chain is broken and communication from the communication bridge 116 to all monitoring circuits of the daisy chain is no longer possible through the daisy chain. However, it is sometimes still desirable and/or advantageous to learn of faults in the system 100. In such examples, the remaining communication couplings are utilized in a bidirectional manner. For example, the communication bridge 116 transmits to both the monitoring circuit 122 and the monitoring circuit 128 and communication progresses through the daisy chain of devices until the unusable coupling of the daisy chain is reached. At that point, the communication reverses course and traverses back over the same couplings, but in the reverse direction, to return to the communication bridge 116 such that a monitoring device that received data from the communication bridge 116 is also a same monitoring device that transmits data back to the communication bridge 116. In this way, an unusable coupling in a daisy chain between the monitoring circuit 122, the monitoring circuit 124, the monitoring circuit 126, and the monitoring circuit 128 does not prevent the continued detection and reporting of faults in the system 100.

Figure 2:
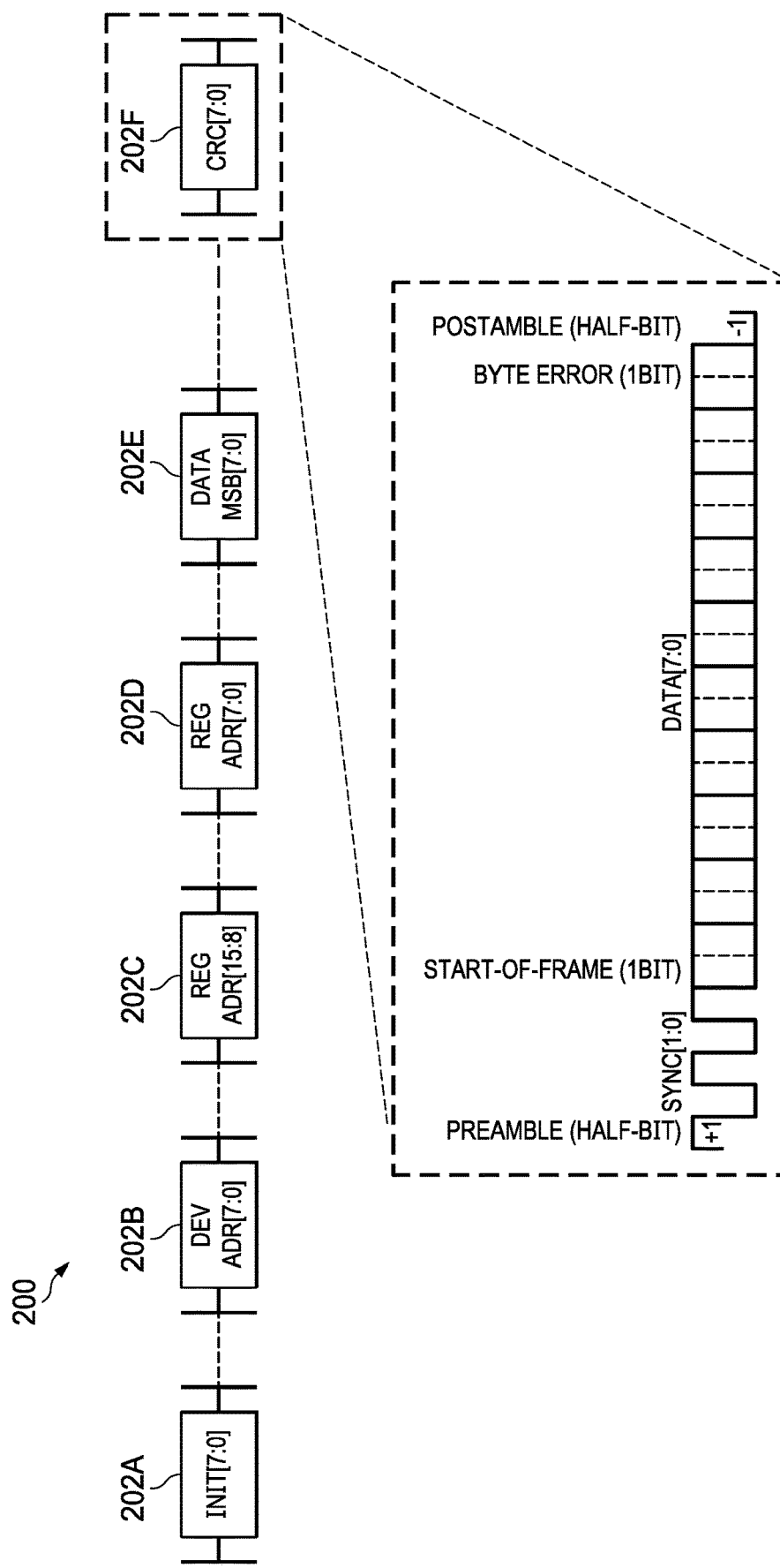
FIG. 2 shows a schematic diagram of an illustrative data frame in accordance with various examples.

Turning now to FIG. 2, a diagram of an illustrative data frame 200 is shown. In at least some examples, the data frame 200 is suitable for implementation as the data frame discussed above with respect to the system 100 of FIG. 1. Accordingly, reference may be made to at least some components of the system 100 in describing the data frame 200. However, while the data frame 200 is illustrated and described as one possible implementation for the data frame discussed with respect to the system 100, the data frame 200 is not exclusive in its suitability for use in the system 100. Other data frame formats, or similar data frames with different byte formats, may also be suitable for implementation as the data frame discussed with respect to the system 100 and such other data frames and/or data bytes are included within the scope of the present disclosure. In at least some examples, the data frame 200 is representative of a format of a command frame and a response frame, as discussed herein.

The data frame 200 includes a plurality of bytes 202A, 202B, 202C, 202D, 202E, and 202F. While the data frame 200 is illustrated as including six bytes, in various examples, the data frame 200 includes any suitable number of bytes, such as more than, or fewer than, six bytes. In at least some examples, the byte 202A is an initialization byte that includes general information regarding the data frame. In at least some examples of the data frame 200, the byte 202A is a first byte of the data frame 200 and a SOF data bit of the byte 202A being set to a logical 1 value indicates to a device receiving the data frame 200 that the data frame 200 is beginning. The byte 202B, in at least some examples, is a device address byte. In at least some examples of the data frame 200, the byte 202B is a second byte of the data frame 200. The byte 202B, in some examples, includes an address or other indication of a device to which the data frame 200 is addressed. For example, in the system 100 the byte 202B includes an address or other indication of one of the monitoring circuit 122, the monitoring circuit 124, the monitoring circuit 126, or the monitoring circuit 128. In at least some examples, a SOF data bit of the byte 202B is repurposed for use in indicating whether a fault exists in a system through which the data frame 200 passes. The byte 202C, in some examples, includes an upper half (e.g., a most-significant 8 bits) of a register address. The register address is, in some examples, an address of a register of one of the monitoring circuit 122, the monitoring circuit 124, the monitoring circuit 126, or the monitoring circuit 128 and instructs that respective monitoring circuit which register to write to and/or read from. In at least some examples of the data frame 200, the byte 202C is a third byte of the data frame 200. In at least some examples, a SOF data bit of the byte 202C is repurposed for use in indicating whether a fault exists in a system through which the data frame 200 passes. The byte 202D, in some examples, includes a lower half (e.g., least-significant 8 bits) of the register address. In at least some examples of the data frame 200, the byte 202D is a fourth byte of the data frame 200. In at least some examples, a SOF data bit of the byte 202D is repurposed for use in indicating whether a fault exists in a system through which the data frame 200 passes.

The byte 202E, in some examples, is a data byte. The byte 202E, in at least some examples, includes payload data being communicated via the data frame 202. While only one data byte is illustrated, in at least some examples, the data frame includes a plurality of data bytes based on a maximum amount of data transmittable in a single data frame 200. The byte 202F, in at least some examples, is a cyclic redundancy check (CRC) byte. The byte 202F, in at least some examples, is an error detection byte that indicates whether the data frame 200 has become corrupted in transmission or is otherwise unreliable.

As discussed elsewhere herein, in at least some examples, after a device receives the SOF data bit of the byte 202A, a remainder of SOF data bits in the data frame 200 are often unused. At least some of these otherwise unused SOF data bits are repurposed for the fault detection of the present disclosure. In at least some examples, SOF data bits of one or more of the byte 202B, byte 202C, byte 202D, and/or byte 202E are repurposed for the fault detection of the present disclosure without repurposing the SOF data bit of byte 202F or other data bytes (not shown) appearing in the data frame 200. In at least some examples, this selection of one or more of one or more of the byte 202B, byte 202C, byte 202D, and/or byte 202E is made because a number of data bytes in the data frame 200 may vary, leading to unpredictable positioning and/or quantity. Thus, at least some implementations of the fault detection of the present disclosure rely on usage of SOF data bits only of one or more bytes which are included in each variation and/or implementation of the data frame 200.

Although the byte 202B, byte 202C, byte 202D, and byte 202E are described as a "byte" which customarily includes eight data bits, at least some of the byte 202B, byte 202C, byte 202D, and/or byte 202E include, or are associated with, additional data bits referred to as overhead. For example, in at least one implementation, each of the byte 202B, byte 202C, byte 202D, and/or byte 202E include about five data bits of overhead data. For example, as illustrated in the callout of the byte 202E, in at least some implementations, at least some of the byte 202B, byte 202C, byte 202D, and/or byte 202E include a one-half bit Preamble, a two-bit SYNC pattern, the one-bit SOF data bit, a one-bit Byte Error bit, and a one-half bit Postamble around an eight-bit Data portion. Accordingly, as used herein the term byte includes eight bits of data plus five bits of overhead data including at least a SOF data bit. In at least some examples, the Data portion of the byte 202B, byte 202C, byte 202D, and/or byte 202E is received by the communication bridge 116 from the microcontroller 118 for command frames and is forwarded to the microcontroller 118 from the communication bridge 116 for response frames.

Figure 3:
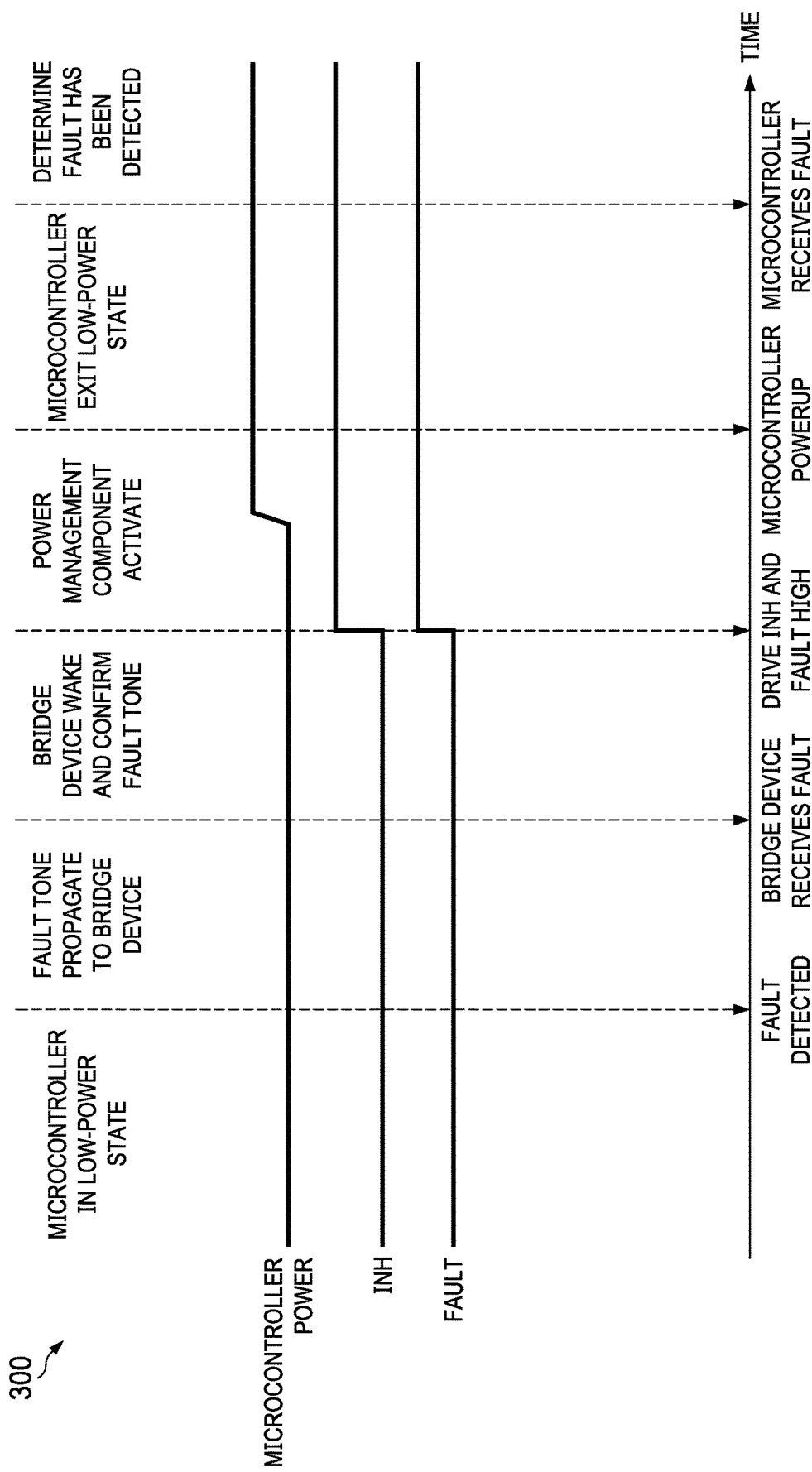
FIG. 3 shows a timing diagram of signal generation in a system in accordance with various examples.

Turning now to FIG. 3, a timing diagram 300 of signal generation in the system 100 is shown. In at least some examples, the timing diagram 300 illustrates timing and signals associated with detection of a fault in a system and reporting of the fault to a controller in a low-power state. In at least some examples, the timing diagram 300 is illustrative of at least some signals present in the system 100 of FIG. 1. Accordingly, reference may be made to components and/or signals of the system 100 in describing the timing diagram 300.

As illustrated by the timing diagram 300, when a monitoring circuit detects a fault, the monitoring circuit outputs a fault tone and the fault tone propagates back to the communication bridge 116. The monitoring circuit is any one of the monitoring circuit 122, the monitoring circuit 124, the monitoring circuit 126, or the monitoring circuit 128. When the communication bridge 116 receives the fault signal, in at least some examples, the communication bridge 116 is in a low-power or sleep mode and the fault signal operates as an interrupt to wake the communication bridge 116. In other examples, the communication bridge 116 is in an active state (e.g., the communication bridge is transmitting heartbeat signals). When the communication bridge 116 receives the fault signal, the communication bridge 116 confirms the fault tone based on a pattern of pulses of the fault tone. When the communication bridge 116 confirms the fault tone as being valid, the communication bridge 116 sources current to a pin of the communication bridge 116 at which the communication bridge 116 outputs the trigger signal (illustrated in FIG. 3 as INH) to the power management component 120 and a pin at which the communication bridge 116 outputs the fault detect signal (illustrated in FIG. 3 as FAULT). Sourcing the current to the pin, in at least some examples, drives the pin high so that a value of logical 1 is present at the pin, as shown by the timing diagram 300.

When INH is driven to a value of logical 1, the power management component 120 activates, sourcing power to the microcontroller 118 and causing the microcontroller 118 to activate, exiting the low-power state. A state of a power supply to the microcontroller 118 is illustrated in FIG. 3 as MICROCONTROLLER POWER. When the microcontroller 118 activates, the microcontroller 118 receives FAULT and determines that the fault is present in the system 100.

Figure 4:
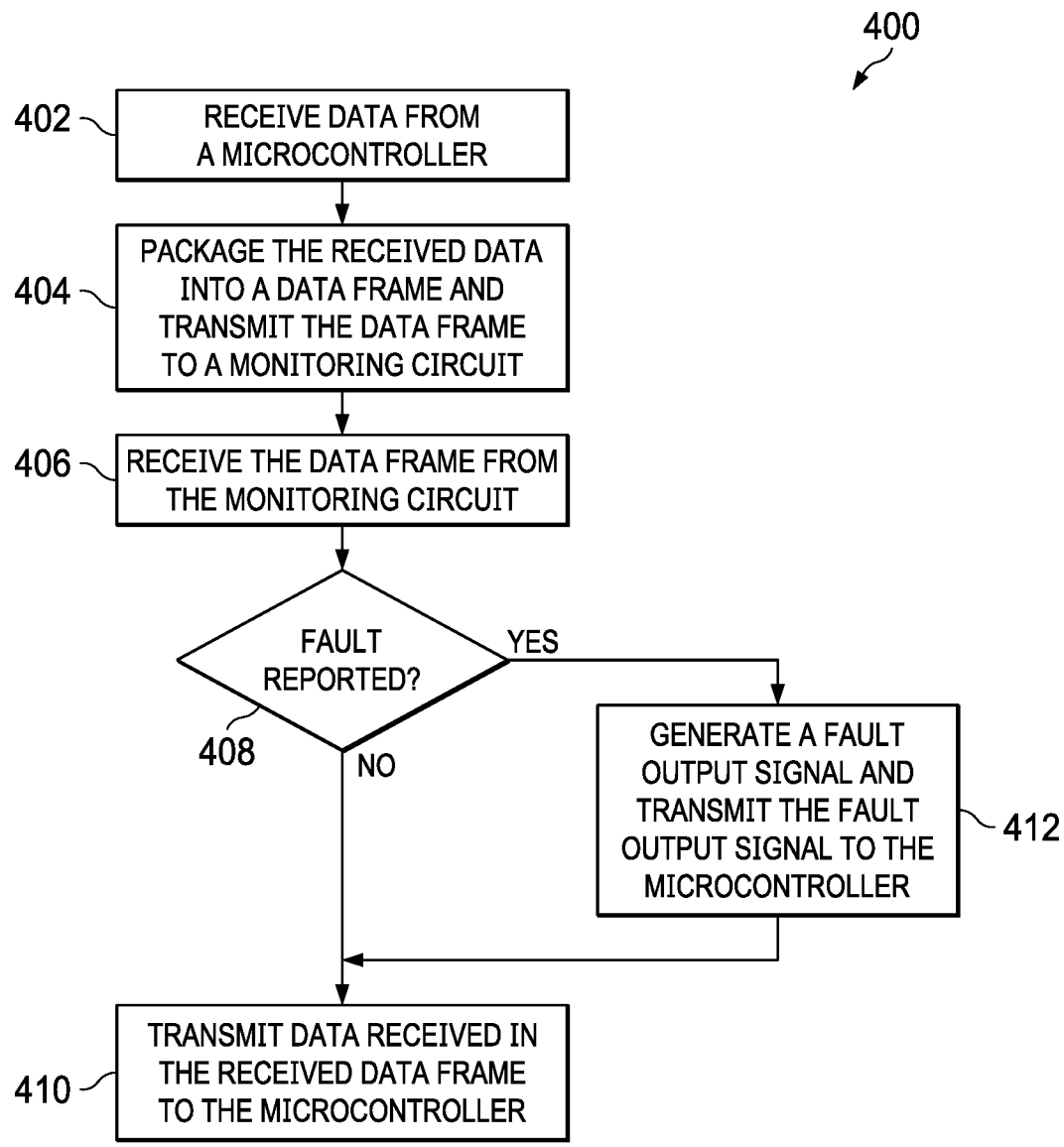
FIG. 4 shows a flowchart of an illustrative method in accordance with various examples.

Turning now to FIG. 4, a flowchart of an illustrative method 400 of fault detection is shown. In at least some examples, the method 400 is implemented at least partially by the communication bridge 116 of the system 100 of FIG. 1. Accordingly, reference may be made to at least some components and/or signals of the system 100 in describing the method 400. In at least some examples, the method 400 is a method for fault detection via a communication data frame. The fault detection is performed, in at least some examples, without modifying a structure of the data frame. For example, the fault detection is performed in some implementations without adding additional data bits and/or bytes to the data frame for the purpose of performing the fault detection and/or notification associated with the fault detection. In other implementations, one or more additional data bits and/or bytes are added to the data frame to facilitate the fault detection having a greater amount of detail regarding a detected fault (e.g., a nature of the fault, a location or relative/approximate location of the fault, etc.).

At operation 402, data is received from the microcontroller 118. The data includes any one or more of a device address, a register address, or payload data. The device address, in at least some examples, indicates a monitoring circuit (e.g., one of the monitoring circuit 122, the monitoring circuit 124, the monitoring circuit 126, or the monitoring circuit 128) to which the microcontroller 118 wishes to send the payload data.

At operation 404, the communication bridge 116 packages the received data into a data frame and transmits the data frame to the monitoring circuit 122. Alternatively, in some examples the communication bridge 116 transmits the data frame to the monitoring circuit 128.

At operation 406, the communication bridge 116 receives the data frame from the monitoring circuit 128 (when the communication bridge 116 initially transmitted the data frame to the monitoring circuit 122). Alternatively, in some examples, the communication bridge 116 receives the data frame from the monitoring circuit 122 (when the communication bridge 116 initially transmitted the data frame to the monitoring circuit 128).

At operation 408, the communication bridge 116 determines whether a fault has been reported in the received data frame. In at least some examples, the communication bridge 116 determines whether a fault has been reported in the received data frame by examining one or more data bits of the data frame to determine whether the data bits have been set to a value of logical 1. For example, in at least one implementation, the communication bridge 116 examines SOF data bits of one or more bytes of the data frame other than a first byte of the data frame to determine whether the data bits have been set to a value of logical 1. In some examples, the communication bridge 116 determines that a fault exists in the system 100 when one examined bit has been set to a value of logical 1. In other examples, the communication bridge 116 determines that a fault exists in the system 100 when more than one examined bit has been set to a value of logical 1. When a fault has not been reported in the received data frame, the method proceeds to operation 410. When a fault has been reported in the received data frame, the method proceeds to operation 412.

At operation 410, the communication bridge 116 transmits data received in the received data frame to the microcontroller 118 and waits to receive new data (e.g., such as by returning to operation 402). At operation 412, the communication bridge 116 generates the fault output signal and transmits the fault output signal to the microcontroller 118. The communication bridge 116 further transmits data received in the received data frame to the microcontroller 118, such as by returning to the operation 410.

Figure 5:
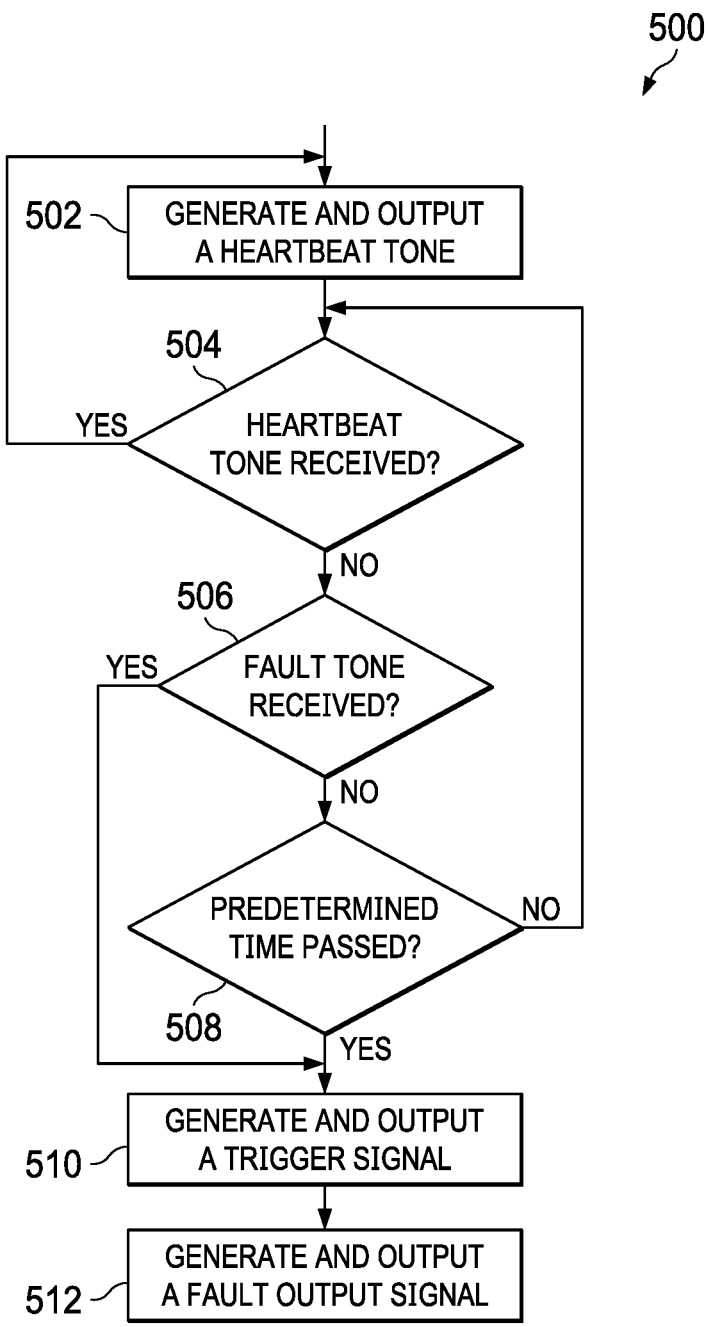
FIG. 5 shows a flowchart of an illustrative method in accordance with various examples.

Turning now to FIG. 5, a flowchart of an illustrative method 500 of fault detection is shown. In at least some examples, the method 500 is implemented at least partially by the communication bridge 116 of the system 100 of FIG. 1. Accordingly, reference may be made to at least some components and/or signals of the system 100 in describing the method 500. In at least some examples, the method 500 is a method for fault detection when the microcontroller 118 is in a low-power state. When the microcontroller 118 is in the low-power state the communication bridge 116 does not receive data from the microcontroller 118 for inclusion in a data frame, as described above with respect to the method 400 of FIG. 4. Instead, when the microcontroller 118 is in the low-power state, the fault detection is performed, in at least some examples, via a heartbeat tone and/or a fault tone.

At operation 502, the communication bridge 116 generates and outputs a heartbeat tone. The heartbeat tone, in at least some examples, is a signal having a predetermined pattern of signal pulses.

At operation 504, the communication bridge 116 determines whether the heartbeat tone has been received. Receipt of the heartbeat tone by the communication bridge 116 indicates that a fault is not present in the system 100. When the heartbeat tone is received, the method 500 returns to operation 502. When the heartbeat tone is not received, the method 500 proceeds to operations 506.

At operation 506, the communication bridge 116 determines whether a fault tone has been received. The heartbeat tone, in at least some examples, is another signal having a different predetermined pattern of pulses. Receipt of the fault tone by the communication bridge 116 indicates that a fault is present in the system 100. When the fault tone is received, the method 500 proceeds to operation 510. When the fault tone is not received, the method 500 proceeds to operations 508.

At operation 508, the communication bridge 116 determines whether a predetermined period of time has passed since the heartbeat tone was sent at operation 502. When the predetermined period of time has passed (e.g., exceeded a permitted threshold), or alternatively, when a countdown timer begun when the heartbeat tone was sent at operation 502 has expired, the communication bridge 116 determines that a fault exists in the system 100. When the communication bridge 116 determines at operation 508 that a fault exists in the system 100, the method 500 proceeds to operation 510. When the predetermined period of time has not passed, the method 500 returns to operation 504.

At operation 510, the communication bridge 116 generates and outputs the trigger signal. The trigger signal, in at least some examples, causes the power management component 120 to cause the microcontroller 118 to exit the low-power state (e.g., either a sleep mode or a shutdown mode).

At operation 512, which in some examples is performed concurrently with operation 510, the communication bridge 116 generates and outputs the fault output signal. The fault output signal, in at least some examples, informs the microcontroller 118 that a fault has been detected in the system 100.

In at least some examples, the operation 502, the operation 504, and the operation 508 are omitted such that the method 500 begins with operation 506, remains at operation 506 until the "Yes" condition is met, and then proceeds to operation 510. Such an implementation of the method 500 occurs when, for example, the communication bridge 116 is in a low-power or shutdown mode. In these examples, the communication bridge 116 does not generate and output the heartbeat tone and ignores received heartbeat tones. Instead, in these modes the communication bridge 116 is woken on receipt of the fault tone.

Figure 6:
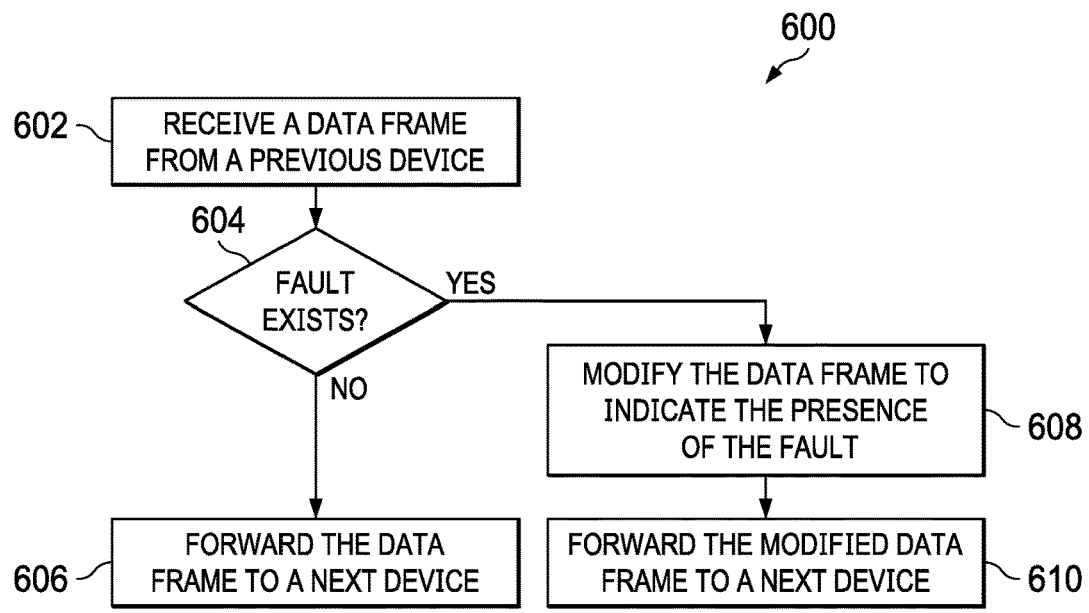
FIG. 6 shows a flowchart of an illustrative method in accordance with various examples.

Turning now to FIG. 6, a flowchart of an illustrative method 600 of fault detection is shown. In at least some examples, the method 600 is implemented at least partially by one or more of the monitoring circuit 122, the monitoring circuit 124, the monitoring circuit 126, or the monitoring circuit 128 of the system 100 of FIG. 1. Accordingly, reference may be made to at least some components and/or signals of the system 100 in describing the method 600. Thus, while the method 600 will be described with respect to the monitoring circuit 122, the method 600 is equally applicable to the monitoring circuit 124, the monitoring circuit 126, and the monitoring circuit 128. In at least some examples, the method 600 is a method for fault detection via a communication data frame. The fault detection is performed, in at least some examples, without modifying a structure of the data frame. For example, the fault detection is performed in some implementations without adding additional data bits and/or bytes to the data frame for the purpose of performing the fault detection and/or notification associated with the fault detection. In other implementations, one or more additional data bits and/or bytes are added to the data frame to facilitate the fault detection having a greater amount of detail regarding a detected fault (e.g., a nature of the fault, a location or relative/approximate location of the fault, etc.).

At operation 602, a data frame is received from a previous device. In the context of the monitoring circuit 122, the data frame is received from the communication bridge 116. In some examples, the data frame is addressed to the monitoring circuit 122 and/or includes data directed to the monitoring circuit 122. In such examples, after receiving the data frame, the monitoring circuit 122 performs one or more actions related to the data frame being addressed to the monitoring circuit 122 and the scope of these actions is not limited herein. In at least some examples, processing the data frame includes the monitoring circuit 122 reading data from the data frame. In other examples, processing the data frame includes the monitoring circuit 122 creating a new data frame (e.g., a response frame).

At operation 604, the monitoring circuit 122 determines whether a fault exists in the system 100. In at least some examples, the monitoring circuit 122 performs monitoring of one or more components of the system 100 (e.g., such as the component 108) to determine whether a fault exists with the monitored component(s). When the monitoring circuit 122 determines that no fault exists in the system 100, the method 600 proceeds to operation 606. When the monitoring circuit 122 determines that a fault exists in the system 100, the method 600 proceeds to operation 608.

At operation 606, the monitoring circuit 122 forwards the data frame from operation 602 to a next device. In the context of the monitoring circuit 122, when the data frame is a command frame, the data frame is forwarded (e.g., transmitted) to the monitoring circuit 124. Further in the context of the monitoring circuit 122, when the data frame is a response frame, the data frame is forwarded (e.g., transmitted) to the communication bridge 116.

At operation 608, the monitoring circuit 122 modifies the data frame to indicate the presence of the fault in the system 100. In at least some examples, modifying the data frame includes setting one or more data bits of the data frame to a value of logical 1. The data bits are, in at least some implementations, SOF data bits of one or more bytes of the data frame. For example, the SOF data bits are SOF data bits of one or more bytes of the data frame other than a first byte of the data frame. Setting the one or more data bits, in at least some examples, comprises performing a logical OR operation between the data bit(s) being set and a value of logical 1. In other examples, modifying the data frame includes modifying the content of one or more bytes of the data frame (e.g., such as to indicate that a fault exists, indicate a nature of a fault, indicate a location of a fault, etc.).

At operation 610, the monitoring circuit 122 forwards the modified data frame to a next device. In at least some examples, the forwarding is performed in a manner substantially the same as operation 606.

Figure 7:
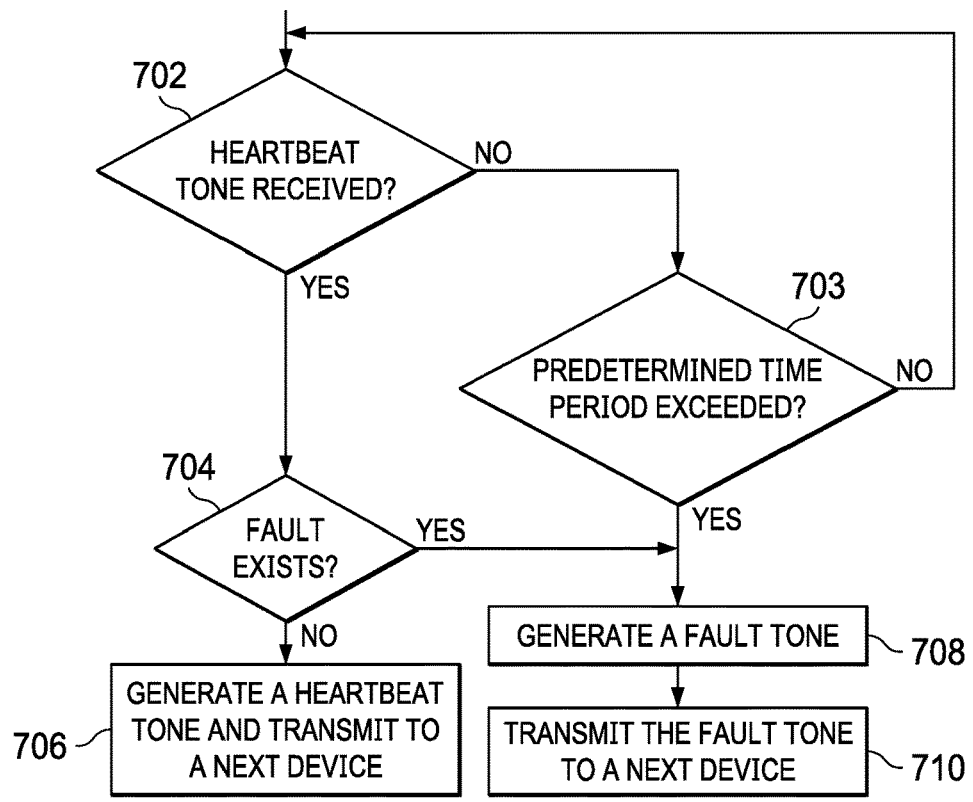
FIG. 7 shows a flowchart of an illustrative method in accordance with various examples.

Turning now to FIG. 7, a flowchart of an illustrative method 700 is shown. In at least some examples, the method 700 is implemented at least partially by one or more of the monitoring circuit 122, the monitoring circuit 124, the monitoring circuit 126, or the monitoring circuit 128 of the system 100 of FIG. 1. Accordingly, reference may be made to at least some components and/or signals of the system 100 in describing the method 700. Thus, while the method 700 will be described with respect to the monitoring circuit 122, the method 700 is equally applicable to the monitoring circuit 124, the monitoring circuit 126, and the monitoring circuit 128. In at least some examples, the method 700 is a method for fault detection when the microcontroller 118 is in a low-power state. When the microcontroller 118 is in the low-power state the communication bridge 116 does not receive data from the microcontroller 118 for inclusion in a data frame, as described elsewhere herein, thus the monitoring circuit 122 does not receive a data frame such as described above with respect to the method 600 of FIG. 6. Instead, when the microcontroller 118 is in the low-power state, the fault detection is performed, in at least some examples, via a heartbeat tone and/or a fault tone.

At operation 702, the monitoring circuit 122 determines whether a heartbeat tone has been received. The heartbeat tone, in at least some examples, is a signal having a predetermined pattern of pulses. The heartbeat tone is received, in at least some examples, from the communication bridge 116. When the heartbeat tone has not been received, the method 700 proceeds to operation 703. When the heartbeat tone has been received, the method 700 proceeds to operation 704.

At operation 703, the monitoring circuit 122 determines whether a predetermined period of time has been exceeded since a last heartbeat tone was received. The period of time is, in some examples, about 1 second when heartbeat tones are transmitted about every 400 milliseconds in the system 100. When the period of time has not been exceeded, the method 700 returns to the operation 702. When the period of time has been exceeded, the method 700 proceeds to operation 706.

At operation 704, the monitoring circuit 122 determines whether a fault exists in the system 100. In at least some examples, the monitoring circuit 122 performs monitoring of one or more components of the system 100 (e.g., such as the component 108) to determine whether a fault exists with the monitored component(s). When the monitoring circuit 122 determines that no fault exists with the monitored component(s), the method 700 proceeds to operation 706. When the monitoring circuit 122 determines that a fault exists in the system 100, the method 700 proceeds to operation 708.

At operation 706, the monitoring circuit 122 generates and transmits the heartbeat tone to a next device. In the context of the monitoring circuit 122, the heartbeat tone is forwarded (e.g., transmitted) to the monitoring circuit 124. In at least some examples in which a communication coupling in the system 100 is broken, such as between the monitoring circuit 122 and the monitoring circuit 124, the next device that receives the heartbeat tone is the communication bridge 116.

At operation 708, the monitoring circuit 122 generates a fault tone. The fault tone, in at least some examples, is a signal having another predetermined pattern of pulses. In some examples, the predetermined pattern of pulses is specific to the monitoring circuit 122. In other examples, the predetermined pattern of pulses of the fault tone is specific to a type or nature of a fault. In yet other examples, the predetermined pattern of pulses is specific to a relative or approximate location of a fault.

At operation 710, the monitoring circuit 122 transmits the fault tone to a next device. In at least some examples, the transmitting is performed in a manner substantially the same as operation 706.

In at least some implementations of the method 700, operation 702, operation 703, and operation 706 are omitted from the method 700. Such an implementation occurs, in some examples, when both the communication bridge 116 and the microcontroller 118 are in a low-power state or sleep mode such that the monitoring circuit 122 does not receive a data frame or a heartbeat tone from the communication bridge 116 but retains an ability to timely report a fault occurring in the system 100.

While the operations of the various methods described herein have been discussed and labeled with numerical reference, in various examples, the methods include additional operations that are not recited herein. In some examples, any one or more of the operations recited herein include one or more sub-operations. In some examples, any one or more of the operations recited herein is omitted. In some examples, any one or more of the operations recited herein is performed in an order other than that presented herein (e.g., in a reverse order, substantially simultaneously, overlapping, etc.). Each of these alternatives is intended to fall within the scope of the present disclosure.

Figure 8:
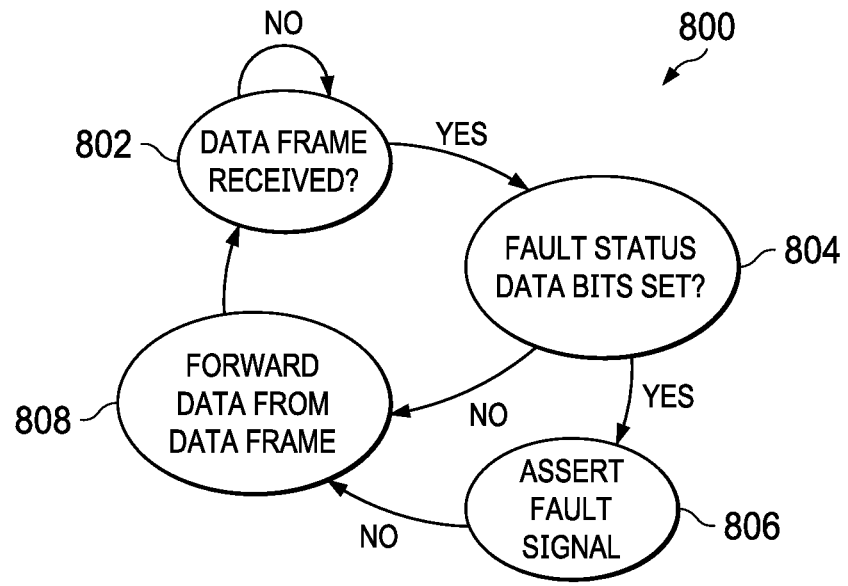
FIG. 8 is a diagram of an illustrative state machine in accordance with various examples.

Turning now to FIG. 8, a diagram of an illustrative state machine 800 is shown. In at least some examples, the state machine 800 is implemented by a communication bridge in a system, such as the communication bridge 116 of the system 100 of FIG. 1. The communication bridge implements the state machine 800 to determine whether a fault exists in the system. In at least some examples, the state machine 800 includes a state 802, a state 804, a state 806, and a state 808.

At state 802, the communication bridge monitors to determine whether a data frame (e.g., a communication data frame) has been received. In at least some examples, the data frame is received from a monitoring circuit, such as the monitoring circuit 122 of the system 100. The data frame, in at least some examples, includes a data portion and an overhead portion. The overhead portion includes one or more SOF data bits. The state machine 800 remains at state 802 until a data frame is received, after which the state machine 800 transitions to state 804.

At state 804, the communication bridge determines whether fault status bits of the data frame are set. The fault status bits being set indicates, in at least some examples, a fault in the system, as discussed in greater detail elsewhere herein. In at least some examples, the fault status bits include one or more SOF data bits, as discussed in greater detail elsewhere herein. In other examples, the fault status bits include one or more other data bits of the data frame. When fault status bits of the data frame are set, the state machine 800 transitions to state 806. When fault status bits of the data frame are not set, the state machine 800 transitions to state 808.

At state 806, the communication bridge asserts a fault signal. The fault signal is provided, in at least some examples, to the microcontroller to inform the microcontroller of the fault in the system. After asserting the fault signal, the state machine 800 transitions to state 808.

At state 808, the communication bridge forwards and/or transmits the data portion of the received data frame to a microcontroller, such as the microcontroller 118 of the system 100. In this way, both data and the indication of the fault in the system are provided in the same data frame, eliminating a need for a separate communication interface or coupling for reporting fault information. Including the data and the indication of the fault in the system in the same data frame, in at least some examples, reduces a bill of materials associated with implementing the system, reducing a cost of implementing the system.

Figure 9:
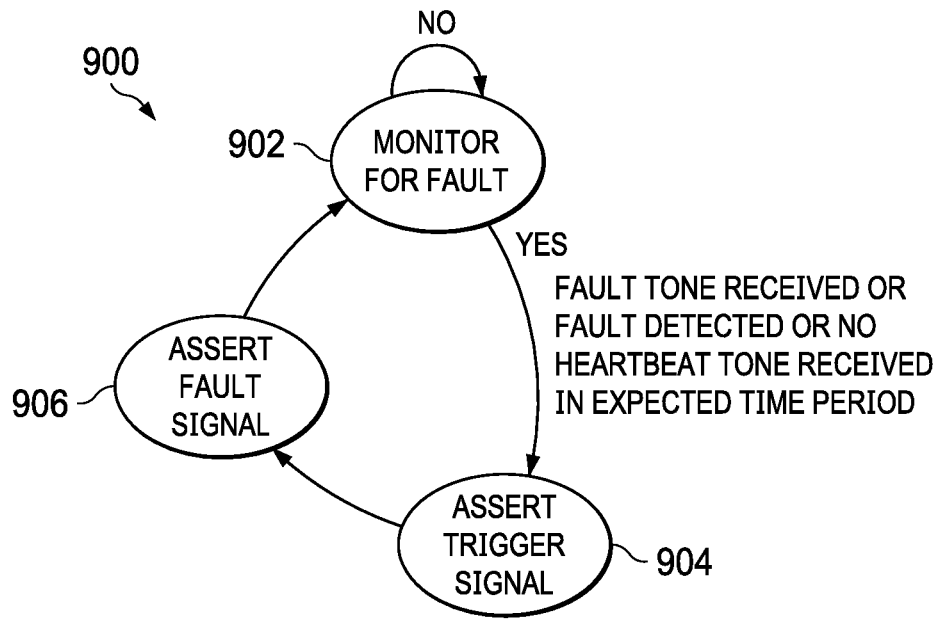
FIG. 9 is a diagram of an illustrative state machine in accordance with various examples.

Turning now to FIG. 9, a diagram of an illustrative state machine 900 is shown. In at least some examples, the state machine 900 is implemented by a communication bridge in a system, such as the communication bridge 116 of the system 100 of FIG. 1. The communication bridge implements the state machine 900 to determine whether a fault exists in the system. In at least some examples, the state machine 900 includes a state 902, a state 904, and a state 906.

At state 902, the communication bridge monitors to determine whether a fault exists in the system. The state machine 900 remains at state 902 until a data frame is received, after which the state machine 900 transitions to state 904. In at least some examples, the state machine 900 determines that the fault exists when the communication bridge itself detects a fault, when the communication bridge receives a fault tone from another device, or when the communication bridge does not receive a heartbeat tone for a predetermined period of time or within an expected time period. In at least some examples, the fault tone and/or the heartbeat tone are received, or would be received, by the communication bridge from a monitoring circuit. In some examples, as an element of monitoring to determine whether a fault exists in the system, the communication bridge generates and transmits a heartbeat tone to a monitoring circuit.

At state 904, the communication bridge asserts a trigger signal. When the communication bridge implements the state machine 900, in at least some examples, a microcontroller coupled to the communication bridge is in a shutdown or powered-down mode and the communication bridge is in a sleep mode (e.g., a low-power mode). Generally, the shutdown mode, the sleep mode, and the low-power mode are collectively referred to as reduced power modes. In at least some examples, the trigger signal causes the microcontroller to exit the reduced-power mode. In some examples, the trigger signal causes the microcontroller to exit the reduced-power mode by causing a power management component to provide a supply voltage to the microcontroller.

At state 906, the communication bridge asserts a fault signal. The fault signal is provided, in at least some examples, to the microcontroller to inform the microcontroller of the fault in the system. After asserting the fault signal, the state machine 900 transitions back to state 902.

Figure 10:
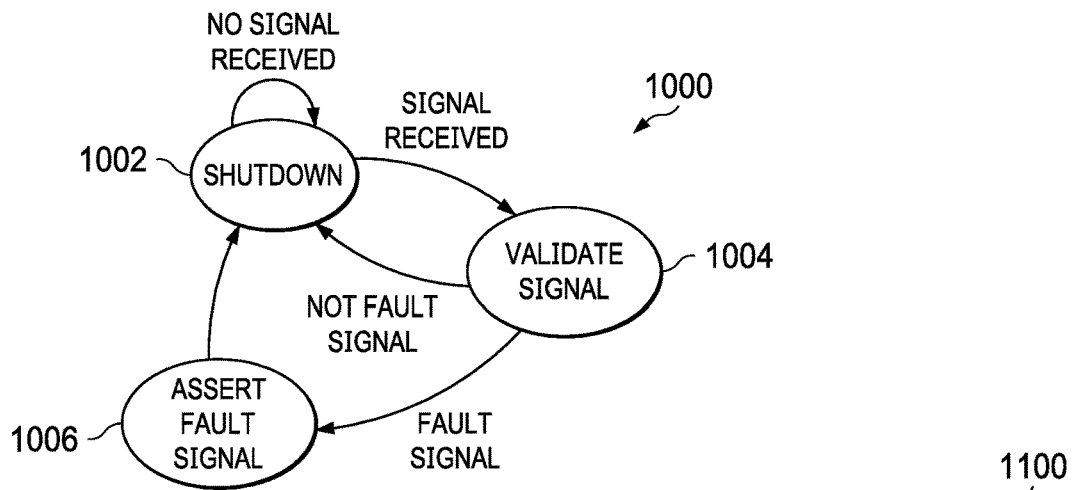
FIG. 10 is a diagram of an illustrative state machine in accordance with various examples.

Turning now to FIG. 10, a diagram of an illustrative state machine 1000 is shown. In at least some examples, the state machine 1000 is implemented by a communication bridge in a system, such as the communication bridge 116 of the system 100 of FIG. 1. The communication bridge implements the state machine 1000 to determine whether a fault exists in the system. In at least some examples, the state machine 1000 includes a state 1002, a state 1004, and a state 1006.

At state 1002, the communication bridge is in a shutdown state. In the shutdown state, the communication bridge consumes less power than when not in the shutdown state. The state machine 1000 remains at state 1002 until a fault tone is received, after which the state machine 1000 transitions to state 1004. In at least some examples, the fault tone is received, or would be received, by the communication bridge from a monitoring circuit. The communication bridge, in some examples, ignores other received signals, such as a heartbeat tone, while operating at state 1002. Receiving the fault tone while in the shutdown mode, in at least some examples, causes the communication bridge to partially wake from the shutdown mode, such as to enter a validate mode.

At state 1004, the communication bridge validates the received fault tone. For example, the communication bridge compares the received fault tone to an expected pattern for the fault tone. When the fault tone is validated, the state machine 1000 transitions to state 1006. When the fault tone is not validated, the state machine 1000 transitions back to state 1002.

At state 1006, the communication bridge asserts a fault signal. The fault signal is provided, in at least some examples, to the microcontroller to inform the microcontroller of the fault in the system. After asserting the fault signal, the state machine 1000 transitions back to state 1002.

Figure 11:
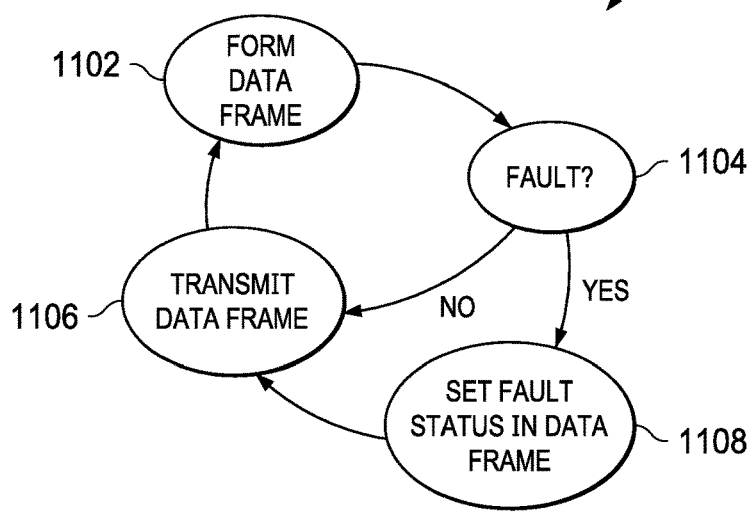
FIG. 11 is a diagram of an illustrative state machine in accordance with various examples.

Turning now to FIG. 11, a diagram of an illustrative state machine 1100 is shown. In at least some examples, the state machine 1100 is implemented at least partially by one or more of the monitoring circuit 122, the monitoring circuit 124, the monitoring circuit 126, or the monitoring circuit 128 of the system 100 of FIG. 1. Thus, while the state machine 1100 will be described with respect to the monitoring circuit 122, the state machine 1100 is equally applicable to the monitoring circuit 124, the monitoring circuit 126, and the monitoring circuit 128. The monitoring circuit implements the state machine 1100 to determine whether a fault exists in the system. In at least some examples, the state machine 1100 includes a state 1102, a state 1104, a state 1106, and a state 1108.

At state 1102, the monitoring circuit forms a data frame. In some examples, forming the data frame comprises reading data from a register and generating the data frame including the data read from the register, as well as one or more additional data elements. In other examples, forming the data frame comprises receiving a data frame and forwarding the received data frame. After forming the data frame, the state machine 1100 transitions to state 1104.

At state 1104, the monitoring circuit determines whether a fault is detected. The fault is, for example, a fault with a component monitored by the monitoring circuit. In at least some examples, the component is an energy storage element, such as a battery of a hybrid or electric vehicle (e.g., such as a component of a hybrid or electric vehicle powertrain or power sub-system). When a fault is not detected, the state machine 1100 transitions to state 1106. When a fault is detected, the state machine 1100 transitions to state 1108.

At state 1106, the monitoring circuit transmits the data frame. In some examples, the data frame is transmitted to another monitoring circuit that itself implements the state machine 1100 or another state machine substantially similar to the state machine 1100. In other examples, the data frame is transmitted to a communication bridge, such as the communication bridge 116 of the system 100. After transmitting the data frame, in at least some examples, the state machine 1100 returns to the state 1102.

At state 1108, the monitoring circuit sets a fault status in the data frame. In at least some examples, setting the fault status comprises performing a logical OR operation between data bit(s) being set and a value of logical 1. In other examples, setting the fault status includes modifying the content of one or more bytes of the data frame (e.g., such as to indicate that a fault exists, indicate a nature of a fault, indicate a location of a fault, etc.). After setting the fault status, the state machine 1100 transitions to the state 1106.

Figure 12:
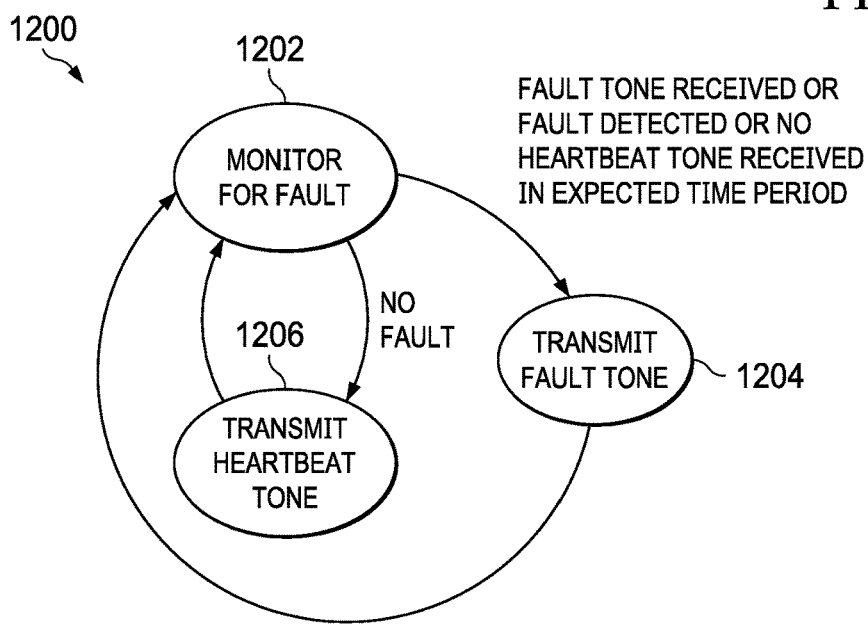
FIG. 12 is a diagram of an illustrative state machine in accordance with various examples.

Turning now to FIG. 12, a diagram of an illustrative state machine 1200 is shown. In at least some examples, the state machine 1200 is implemented at least partially by one or more of the monitoring circuit 122, the monitoring circuit 124, the monitoring circuit 126, or the monitoring circuit 128 of the system 100 of FIG. 1. Thus, while the state machine 1200 will be described with respect to the monitoring circuit 122, the state machine 1200 is equally applicable to the monitoring circuit 124, the monitoring circuit 126, and the monitoring circuit 128. The monitoring circuit implements the state machine 1200 to determine whether a fault exists in the system. In at least some examples, the state machine 1200 includes a state 1202, a state 1204, and a state 1206.

At state 1202, the monitoring circuit monitors to determine whether a fault exists. The fault is, for example, a fault with a component monitored by the monitoring circuit. In at least some examples, the component is an energy storage element, such as a battery of a hybrid or electric vehicle (e.g., such as a component of a hybrid or electric vehicle powertrain or power sub-system). A fault exists when the monitoring device detects a fault with a monitored component, when the monitoring device receives a fault tone from another device, or when the monitoring device does not receive a heartbeat tone for a predetermined period of time or within an expected time period. In at least some examples, the fault tone and/or the heartbeat tone are received, or would be received, by the monitoring device from another monitoring circuit or a communication bridge. When a fault is not detected, the state machine 1200 transitions to state 1206. When a fault is detected, the state machine 1200 transitions to state 1204.

At state 1204, the monitoring circuit generates and transmits a fault tone. The fault tone, in at least some examples, is a signal having another predetermined pattern of pulses. In some examples, the predetermined pattern of pulses is specific to the monitoring circuit generating the fault tone. In other examples, the predetermined pattern of pulses of the fault tone is specific to a type or nature of a fault. In other examples, the predetermined pattern of pulses of the fault tone is specific to a type or nature of a fault. In yet other examples, the predetermined pattern of pulses is specific to a relative or approximate location of a fault. In some examples, the fault tone is transmitted to another monitoring circuit. In other examples, the fault tone is transmitted to a communication bridge. After generating and transmitting the fault tone, in at least some examples, the state machine 1200 transitions to the state 1202.

At state 1206, the monitoring circuit generates and outputs a heartbeat tone. The heartbeat tone, in at least some examples, is a signal having a predetermined pattern of pulses. In some examples, the heartbeat tone is transmitted to another monitoring circuit. In other examples, the heartbeat tone is transmitted to a communication bridge. After transmitting the heartbeat tone, the state machine 1200 transitions back to the state 1202.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hard-wired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain data elements of the present disclosure are defined as being "set" by those data elements being caused to have a value of logical 1, in other examples operation is reversed such that setting the data elements causes the data elements to have a value of logical 0. Unless otherwise stated, "about," "approximately," or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
a microcontroller;
a communication bridge coupled to the microcontroller and configured to implement a state machine comprising:
   a first state configured to receive a data frame comprising data;
   a second state configured to determine whether a system fault is indicated in the data frame, wherein the first state transitions to the second state when the data frame is received;
   a third state configured to assert a fault signal when the system fault is indicated in the data frame, wherein the second states to the third state when the system fault is indicated in the data frame; and
   a fourth state configured to transmit the data from the data frame to the microcontroller, wherein the third state transitions to the fourth state after asserting the fault signal;
a power management component coupled to the microcontroller and the communication bridge; and
wherein the communication bridge is configured to implement a second state machine comprising:
   a fifth state configured to monitor for the system fault when the microcontroller is in a reduced-power state;
   a sixth state configured to assert a trigger signal and transmit the trigger signal to the power management component, wherein the trigger signal causes the power management component to remove the microcontroller from the reduced-power state, and wherein the fifth state transition to the sixth state when the communication bridge determines that a fault exists; and
   a seventh state configured to assert the fault signal, wherein the sixth state transitions to the seventh state after asserting the trigger signal.

2. The circuit of claim 1, wherein the communication bridge transmits the fault signal to the microcontroller.

3. The circuit of claim 1, wherein the system fault is indicated in a start of frame bit of the data frame.

4. The circuit of claim 3, wherein the system fault is indicated in start of frame bits of a plurality of bytes of the data frame.

5. The circuit of claim 4, wherein the system fault is indicated in the data frame when a majority of the start of frame bits of the plurality of bytes of the data frame is asserted.

6. The circuit of claim 1, wherein the communication bridge determines that the fault exists when the communication bridge detects a fault, receives a fault tone, or does not receive a heartbeat tone for a predetermined period of time.

7. A circuit, comprising:
a register; and
a monitoring circuit coupled to the register and configured to implement a state machine comprising:
  a first state configured to generate a data frame including at least some data from the register;
  a second state configured to determine a system fault status, wherein the first state transitions to the second state after generating the data frame;
  a third state configured to set a fault status indication of the data frame when a fault exists in the system, wherein the second state transitions to the third state when the monitoring circuit detects a fault; and
  a fourth state configured to transmit the data frame to a next device, wherein the second state transitions to the fourth state when the monitoring circuit does not detect a fault, and wherein the third state transitions to the fourth state after setting the fault status indication of the data frame;
  a fifth state configured to monitor for the fault;
  a sixth state configured to generate and transmit a fault tone, wherein the fifth state transition to the sixth state when the monitoring circuit determines that a fault exists; and
  a seventh state configured to generate and transmit a heartbeat tone, wherein the fifth state transitions to the seventh state when the monitoring circuit determines that no fault exists.

8. The circuit of claim 7, wherein the fault status is indicated in a start of frame bit of the data frame.

9. The circuit of claim 8, wherein the fault status is indicated in start of frame bits of a plurality of bytes of the data frame.

10. The circuit of claim 9, wherein the fault status is indicated in the data frame when a majority of the start of frame bits of the plurality of bytes of the data frame is asserted.

11. The circuit of claim 7, wherein the monitoring circuit is configured to transmit the data frame to a communication controller that detects the fault status indication and generates a fault signal in response to detection of the fault status indication.

12. The circuit of claim 7, wherein the monitoring circuit generates and transmits the fault tone when the monitoring circuit detects a fault, receives a fault tone, or does not receive a heartbeat tone for a predetermined period of time.

13. A system, comprising:
a microcontroller;
a monitoring circuit adapted to be coupled to an energy storage element and configured to:
  determine whether a fault associated with the energy storage element is present;
  generate a fault tone indicative of the fault when the fault with the energy storage element is present; and
  transmit the fault tone; and
a communication bridge connected to the microcontroller and configured to:
  receive the indication of the fault; and
  assert a fault signal and transmit the fault signal to the microcontroller; and
wherein the communication bridge is in a reduced power mode and the fault tone wakes the communication bridge to cause the communication bridge to assert the fault signal and a trigger signal.

14. The system of claim 13, wherein the microcontroller is in a reduced power mode, and wherein the trigger signal causes the microcontroller to wake from the reduced power mode.

15. The system of claim 13, wherein the indication of the fault is a plurality of start of frame bits of a communication frame being asserted, and wherein the communication frame is generated by the monitoring circuit and includes data for transmission to the microcontroller from the monitoring circuit.

* * * * *